US 8,269,491 B2

(12) United States Patent
Cummings et al.

(10) Patent No.: US 8,269,491 B2
(45) Date of Patent: Sep. 18, 2012

(54) DC OFFSET REMOVAL FOR A MAGNETIC FIELD SENSOR

(75) Inventors: John Cummings, Nashua, NH (US); William P. Taylor, Amherst, NH (US); David J. Haas, Weare, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 1210 days.

(21) Appl. No.: 12/038,119

(22) Filed: Feb. 27, 2008

(65) Prior Publication Data
US 2009/0212771 A1 Aug. 27, 2009

(51) Int. Cl.
G01R 33/09 (2006.01)
G01N 27/72 (2006.01)
(52) U.S. Cl. ............... 324/252; 324/117 H; 324/225
(58) Field of Classification Search ............ 324/117 H, 324/252, 117 R, 225
See application file for complete search history.

(56) References Cited

U.S. PATENT DOCUMENTS

| | | |
|---|---|---|
| 5,247,278 A | 9/1993 | Pant et al. |
| 5,270,882 A | 12/1993 | Jove et al. |
| 5,331,478 A | 7/1994 | Aranovsky |
| 5,521,501 A | 5/1996 | Dettmann et al. |
| 5,561,366 A | 10/1996 | Takahashi et al. |
| 5,574,364 A * | 11/1996 | Kajimoto et al. ........ 324/207.12 |
| 5,614,851 A | 3/1997 | Holzer et al. |
| 5,686,838 A | 11/1997 | van den Berg |
| 5,831,426 A | 11/1998 | Black, Jr. et al. |
| 5,831,784 A | 11/1998 | Barnett et al. |
| 5,841,318 A * | 11/1998 | Cram ............................ 330/9 |
| 5,886,842 A | 3/1999 | Ziperovich |
| 6,094,330 A | 7/2000 | Criniti et al. |
| 6,150,876 A | 11/2000 | Ngo |
| 6,166,539 A | 12/2000 | Dahlberg et al. |
| 6,191,577 B1 * | 2/2001 | Sasaki et al. ............. 324/207.21 |
| 6,316,931 B1 | 11/2001 | Nakagawa et al. |
| 6,323,634 B1 | 11/2001 | Nakagawa et al. |
| 6,411,078 B1 | 6/2002 | Nakagawa et al. |
| 6,429,640 B1 | 8/2002 | Daughton et al. |
| 6,433,981 B1 | 8/2002 | Fletcher et al. |
| 6,445,171 B2 | 9/2002 | Sandquist et al. |

(Continued)

FOREIGN PATENT DOCUMENTS

DE 198 34 153 A1 2/2000

(Continued)

OTHER PUBLICATIONS

Notification and International Preliminary Report on Patentability (Form PCT/IB/373) for PCT/US2009/031631, dated Sep. 10, 2010, 9 pages.

(Continued)

*Primary Examiner* — Jay Patidar
(74) *Attorney, Agent, or Firm* — Daly, Crowley, Mofford & Durkee, LLP

(57) ABSTRACT

Presented is a sensor that includes a magnetoresistive (MR) sensing device to sense a magnetic field and to produce an AC signal voltage proportional to the sensed magnetic field. The sensor also includes circuitry, coupled to the MR sensing device, to remove DC offset from the AC signal voltage. The DC offset may be related to the hysteresis characteristics of the MR sensing device. To remove DC offset, the circuitry may obtain an averaged DC offset and subtract the averaged DC offset from the AC signal voltage to produce a sensor output signal.

8 Claims, 7 Drawing Sheets

U.S. PATENT DOCUMENTS

| | | | |
|---|---|---|---|
| 6,456,063 B1 * | 9/2002 | Moreno et al. | 324/207.12 |
| 6,566,856 B2 | 5/2003 | Sandquist et al. | |
| 6,642,705 B2 | 11/2003 | Kawase | |
| 6,667,682 B2 | 12/2003 | Wan et al. | |
| 6,970,333 B2 | 11/2005 | Boeve | |
| 7,164,263 B2 | 1/2007 | Yakymyshyn et al. | |
| 7,248,045 B2 | 7/2007 | Shoji | |
| 7,336,064 B2 | 2/2008 | Ludwig et al. | |
| 7,391,204 B2 * | 6/2008 | Bicking | 324/207.21 |
| 7,495,624 B2 | 2/2009 | Daalmans | |
| 7,855,555 B2 | 12/2010 | Biziere et al. | |
| 2002/0122265 A1 | 9/2002 | Chambers et al. | |
| 2005/0156587 A1 | 7/2005 | Yakymyshyn et al. | |
| 2005/0264435 A1 * | 12/2005 | Bicking | 341/15 |
| 2006/0071655 A1 | 4/2006 | Shoji | |
| 2006/0091993 A1 | 5/2006 | Shoji | |
| 2006/0114098 A1 | 6/2006 | Shoji | |
| 2006/0145690 A1 | 7/2006 | Shoji | |
| 2006/0170529 A1 | 8/2006 | Shoji | |
| 2006/0192617 A1 | 8/2006 | Barnett | |
| 2006/0291106 A1 | 12/2006 | Shoji | |
| 2007/0044370 A1 | 3/2007 | Shoji | |
| 2007/0070534 A1 * | 3/2007 | Aemireddy et al. | 360/25 |
| 2007/0076332 A1 | 4/2007 | Shoji et al. | |
| 2007/0090825 A1 | 4/2007 | Shoji | |
| 2007/0096716 A1 | 5/2007 | Shoji | |
| 2007/0188946 A1 | 8/2007 | Shoji | |
| 2007/0205750 A1 * | 9/2007 | Yakymyshyn et al. | 324/127 |
| 2010/0157464 A1 * | 6/2010 | Mathew et al. | 360/75 |

FOREIGN PATENT DOCUMENTS

| | | |
|---|---|---|
| DE | 10017374 B4 | 12/2000 |
| DE | 10159607 A1 | 9/2002 |
| DE | 10128150 C1 | 1/2003 |
| DE | 10202287 C1 | 8/2003 |
| DE | 10222395 A1 | 12/2003 |
| DE | 2004003369 A1 | 8/2005 |
| DE | 102004009267 B3 | 9/2005 |
| DE | 102004038847 B3 | 9/2005 |
| DE | 102004040079 B3 | 12/2005 |
| DE | 10155423 B4 | 3/2006 |
| DE | 102005037905 A1 | 3/2006 |
| DE | 102004053551 A1 | 5/2006 |
| DE | 102006008257 A1 | 10/2006 |
| DE | 102006021774 A1 | 1/2007 |
| DE | 102005038655 B3 | 3/2007 |
| DE | 102005040539 B4 | 3/2007 |
| DE | 102005052688 A1 | 5/2007 |
| DE | 102006007770 A1 | 8/2007 |
| DE | 102006028698 B3 | 12/2007 |
| EP | 0 241 770 A1 | 10/1987 |
| EP | 0 251 023 A2 | 1/1988 |
| EP | 0 251 023 A3 | 8/1988 |
| JP | 2003009565 | 1/2003 |
| WO | WO 9610192 A1 * | 4/1996 |
| WO | WO 2005/100922 A2 | 10/2005 |
| WO | WO 2005/100922 A3 | 10/2005 |
| WO | WO 2006/136577 A1 | 12/2006 |
| WO | WO 2007/147760 A2 | 12/2007 |

OTHER PUBLICATIONS

Notification of transmittal of the International Search Report dated Jul. 2, 2009, PCT/US2009/031631.

The International Search report dated Jul. 2, 2009, PCT/US2009/031631.

Written Opinion of the International Searching Authority dated Jul. 2, 2009, PCT/US2009/031631.

* cited by examiner

DC OFFSET REMOVAL FOR A MAGNETIC FIELD SENSOR

CROSS-REFERENCE TO RELATED APPLICATIONS

Not applicable.

STATEMENT REGARDING FEDERALLY SPONSORED RESEARCH

Not applicable.

FIELD OF THE INVENTION

This invention relates generally to magnetic field sensors and, in particular, magnetic field sensors that utilize magnetoresistive (MR) sensing elements.

BACKGROUND OF THE INVENTION

All magnetic materials have hysteresis. Hysteresis, specifically, magnetic hysteresis, refers to the history dependent nature of the magnetic field applied to the material. Because a magnetoresistive (MR) sensor such as a giant magnetoresistive (GMR) sensor is made of magnetic material, its response exhibits the effects of hysteresis. A plot of resistance against applied magnetic field forms a hysteresis loop, as the change in resistance in the forward direction (for increasing applied magnetic field) and the reverse direction (for decreasing applied magnetic field) are not the same. The hysteresis loop thus shows that the resistance doesn't just depend on the applied magnetic field, but also on what the applied magnetic field was previously.

The error resulting from the hysteresis takes the form of a direct current (DC) offset in the sensor output. Although MR sensors such as GMR sensors generally offer higher sensitivity than other types of magnetic field sensors, for example, Hall Effect sensors, they are not presently used for high resolution sensor applications because of their hysteresis characteristics.

SUMMARY OF THE INVENTION

In general, in one aspect, the invention is directed to a sensor. The sensor includes a magnetoresistive (MR) sensing device to sense a magnetic field and to produce an AC signal voltage proportional to the sensed magnetic field. The sensor further includes circuitry, coupled to the MR sensing device, to receive the AC signal voltage and to remove DC offset from the received AC signal voltage.

Embodiments of the invention may include one or more of the following features. The DC offset may be related to hysteresis characteristics of the MR sensing device. The MR sensing device may include a sensing element to sense the magnetic field and that sensing element may be a giant magnetoresistive (GMR) element, a magnetic tunnel junction (MTJ) element, a tunneling magnetoresistance (TMR) element or a anisotropic magnetoresistance (AMR) element. The circuitry may include a DC offset determiner to receive the AC signal voltage as an input and provide an averaged DC offset as an output. The circuitry may further include a device to subtract the averaged DC offset from the AC signal voltage to produce a sensor output signal. The DC offset determiner may include a positive peak detecting portion to produce a positive peak value, a negative peak detecting portion to produce a negative peak value, a summing block to produce a sum of the positive and negative peak values and an averaging circuit to divide the sum by two to produce the averaged DC offset. The positive peak detecting portion, the negative peak detecting portion, the summing block and the averaging circuit may operate in the digital domain. The positive and negative peak detecting portions may include a hold circuit to delay offset determination by the DC offset determiner for at least one clock cycle.

The DC offset determiner may include a cycle averaging circuit to produce a cycle-averaged DC offset based on the averaged DC offset provided for a predetermined number of cycles. A detector may be included in the circuitry to produce an error signal from the averaged DC offset and the cycle-averaged DC offset. The DC offset determiner may include circuitry to adjust the averaged DC offset so that the AC signal voltage includes a non-zero DC component after the DC offset removal.

In another aspect, the invention is directed to a current sensor. The current sensor includes a conductor to which a current to be measured is applied and a MR sensing device, responsive to a magnetic field generated in the conductor when the current is applied to the conductor, to produce an AC signal voltage proportional to the current. The current sensor further includes circuitry, coupled to the MR sensing device, to receive the AC signal voltage and to remove DC offset from the received AC signal voltage.

In another aspect, the invention is directed to a method that includes sensing a magnetic field with an MR sensing device, producing an AC signal voltage proportional to the sensed magnetic field and removing DC offset from the AC signal voltage.

BRIEF DESCRIPTION OF THE DRAWINGS

The foregoing features of the invention, as well as the invention itself may be more fully understood from the following detailed description of the drawings, in which.

Like reference numerals will be used to represent like elements.

DETAILED DESCRIPTION

Figure 1:
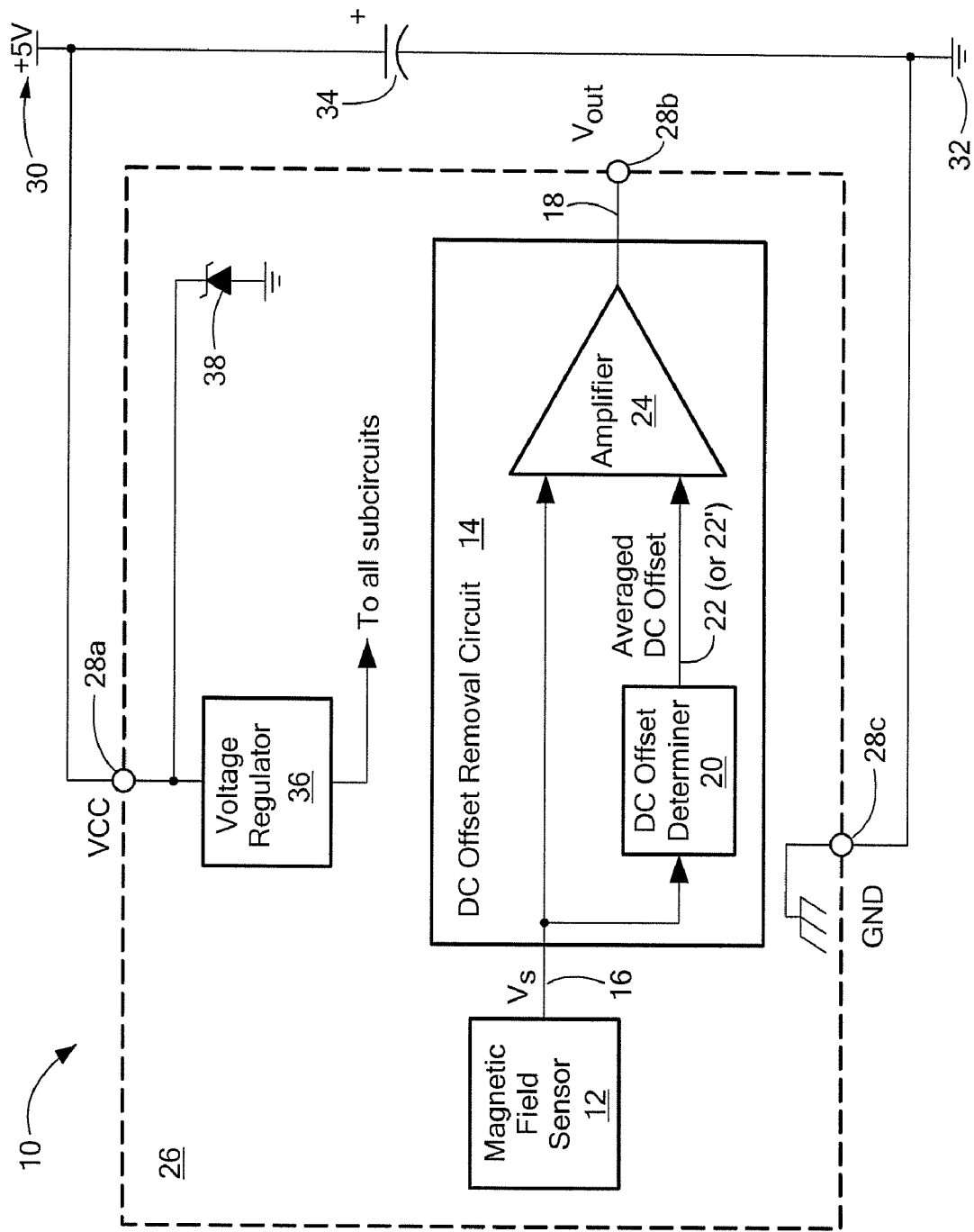
FIG. 1 shows an exemplary sensor with a magnetic field sensor and DC offset removal circuit, which includes a DC offset determiner.

Referring to FIG. 1, a sensor 10 that includes a magnetic field sensor 12 coupled to a DC offset removal circuit 14 is shown. The magnetic field sensor 12 converts a sensed magnetic field into an AC signal voltage, shown as a sensed voltage Vs 16, that is proportional to the sensed magnetic field. The DC offset removal circuit 14 receives as input the voltage Vs 16 measured by the magnetic sensor 12 and provides at the sensor output an AC signal voltage (shown as output voltage Vout 18) that has been adjusted for DC offset. The DC offset removal circuit 14 serves to remove DC offset associated with sensing the magnetic field, in particular, DC offset related hysteresis characteristics of the magnetic field sensor 12. For example, and as will be described more fully below, when the magnetic field sensor 12 employs some type of magnetoresistive (MR) sensing device, the DC offset is a hysteresis-induced DC offset.

An ideal sensor operation is one in which the measured AC signal is centered around a zero point (0V DC) reference, or alternatively, a non-zero point reference based on a known non-zero offset, that is, one that is desired by a user. Any undesired DC offset causes the sensed AC signal to shift in amplitude (in either a positive or negative direction) so that it is no longer symmetric about the zero point reference or relative to a desired non-zero offset. Instead, it is symmetric with respect to the undesired DC offset. It is therefore desirable to remove such undesired DC offset from the AC signal.

Still referring to FIG. 1, the DC offset removal circuit 14 includes a DC offset determiner 20 that determines the amount of undesired DC offset present in the AC signal. The undesired DC offset as determined by the determiner 20 takes the form of an averaged DC offset, shown as averaged DC offset 22 for a single clock cycle, or an averaged DC offset 22' for more than a single clock cycle (also referred to herein as a cycle-averaged DC offset 22'), as will be described later. The DC offset removal circuit 14 further includes a device, shown here as amplifier 24, to separate the undesired DC offset from the sensed AC signal voltage 16. The amplifier 24 receives as inputs the sensed AC signal voltage 16 and the averaged DC offset 22 (or cycle-averaged DC offset 22'). It then subtracts the averaged DC offset 22 (or cycle-averaged DC offset 22') from the sensed AC signal voltage 16 to produce the output voltage Vout 18 at its output, thus effectively removing undesired DC offset introduced as a result of sensing a magnetic field. By canceling or minimizing the effects of hysteresis exhibited by MR sensors in this manner, even very small signals can be accurately measured.

In one embodiment, the sensor 10 is implemented with a sensor integrated circuit (IC) 26 that has pins, terminals or leads 28, labeled 28*a*, 28*b* and 28*c*. Lead 28*a* is a VCC pin to connect to a power supply 30, lead 28*b* is a sensor output Vout pin to enable an external application device to receive or monitor the sensor output voltage Vout 18, and lead 28*c* is a ground (GND) pin to connect to ground 32, as shown. A decoupling capacitor 34 is connected between the power supply 30 and ground 32. Power is supplied to the IC 26 through the VCC pin 28*a*, which is connected internally to a voltage regulator 36. The voltage regulator 36 supplies a substantially constant voltage to subcircuits of the sensor IC 26. Subcircuits such as the magnetic field sensor 12 and DC offset removal circuit 14, obtain power from the voltage regulator 30. A zener diode 38 is provided between the supply side of the voltage regulator 36 and ground to protect the voltage regulator if the supply side is shorted to ground. The GND pin 28*c* is connected internally to provide a ground connection for subcircuits of the sensor. Other circuitry, such as control and clock generation, for example, has been eliminated from the figure for purposes of simplification.

Figure 2:
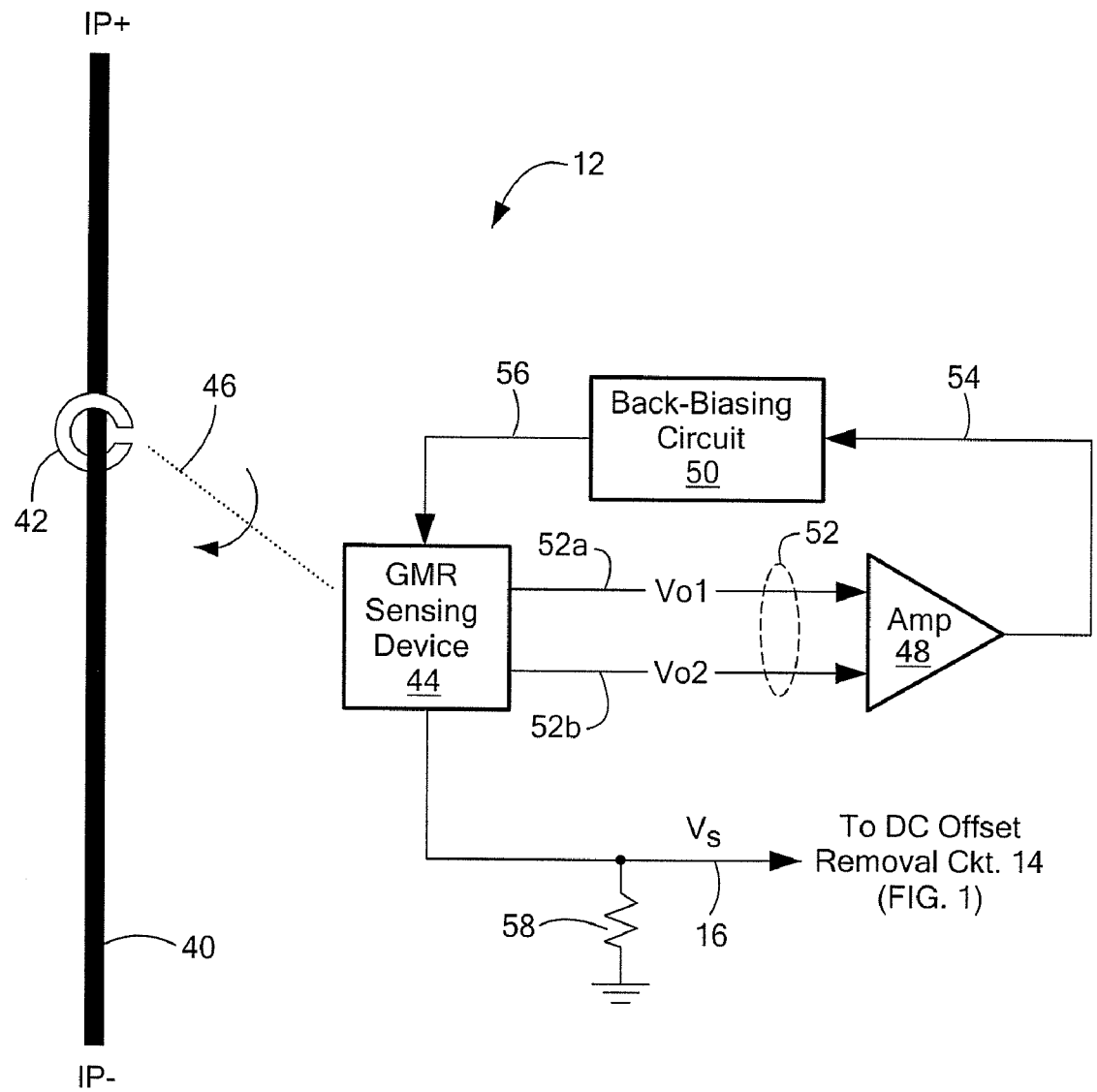
FIG. 2 shows an exemplary magnetic field sensor implemented as a closed-loop current sensor having a giant magnetoresistive (GMR) sensing device.

Referring to FIG. 2, in one exemplary embodiment, the magnetic field sensor 12 is shown as a current sensor. The current sensor 12 includes a conductor 40 and a magnetic core 42. The conductor 40 provides a conduction path between end terminals IP+ and IP−. In an IC implementation, the end terminals may appear as additional I/O pins of the IC. The current sensor 12 is depicted as a simple AC current measuring, closed-loop current sensor. It includes a sensing device 44 that is located near the conductor 40. Applied current flowing through the conductor 40 generates a magnetic field 46, which is sensed by the sensing device 44 and converted to a proportional voltage. The current sensor 12 further includes an operational amplifier 48, which is coupled to the sensing device 44 and a back-biasing circuit 50 that is coupled to the amplifier 48 and the sensing device 44.

In one exemplary embodiment, as shown, the sensing device 44 is a GMR sensing device. The GMR sensing device 44 may include at least one GMR element (that is, a GMR type resistor or magnetoresistor) that is exposed to and senses the magnetic field ("sensing element"). The GMR sensing device 44 may be designed to employ one element that operates as a sensing element, or multiple GMR elements including at least one sensing element. When two or more GMR elements are used, they may be arranged in a full (Wheatstone) or half bridge (voltage divider) configuration. There may be two sensing elements, for example, two spin-valve elements, arranged such that, in the presence of a magnetic field, the resistance of one increases while the resistance of the other decreases.

While the design that is illustrated in FIG. 2 is that of a closed-loop current sensor, other types of current sensors (e.g., other types of closed-loop or open-loop designs) as well as magnetic field sensors that measure other parameters besides current (e.g., displacement) are contemplated as well. Different examples of closed-and open-loop sensor configurations are described in U.S. Pat. No. 7,259,545, entitled "Integrated Sensor," issued on Aug. 21, 2007 in the name of Stauth et al. and assigned to Allegro Microsystems, Inc., the assignee of the subject application.

Also, although the sensing device 44 is shown as a GMR sensing device, the sensing device may be made with any type of MR element, including, but not limited to: GMR, including unpinned sandwich, antiferromagnetic multilayer and spin valve structures; anisotropic magnetoresistance (AMR); magnetic tunnel junction (MTJ, also known as spin-dependent tunneling or "SDT"); and tunneling magnetoresistance (TMR). The DC offset removal mechanism provided herein may also find use in Hall-Effect sensors in lieu of or in addition to known Hall-Effect sensor DC offset cancellation or adjustment schemes, such as chopper stabilization and active plate switching.

A current to be measured by the sensing device 44 would be applied to the conduction path of the conductor 40. During operation, the applied current flowing through the conduction path generates a magnetic field, which is sensed by the one or more sensing (or active) elements of the sensing device. The sensed magnetic field 46 changes the resistance of any internal sensing elements of the sensing device 44. The difference amplifier 48 receives a voltage 52 produced by the GMR sensing device 44, shown here as a differential voltage available between signals Vo1 and Vo2 (indicated as 52*a* and 52*b*, respectively), and, in turn, drives the back-biasing circuit 50 via output signal 54. The back-biasing circuit 50 may be implemented as a push-pull output stage consisting of a matched bipolar junction transistor pair. The back-biasing circuit 50 in turn produces a feedback signal 56. The feedback signal 56 is applied to an internal compensating current loop (not shown) of the sensing device 44, which causes the flux gradient to be driven to zero.

Typically, in a closed-loop arrangement such as that shown, the sensing device 44 also includes feedback coils positioned in close proximity to the sensing elements. The feedback coils on the sensing device 44 are used to generate a magnetic field to oppose the field generated by the current in the conductor 40. The current required to null the flux is the current sensor output, with a resistor 58 converting that current to the sensed voltage Vs 16. The back-biasing circuit 50, along with the feedback coils, provides closed-loop control that maintains the sensing elements near the zero magnetic flux point.

Figure 3:
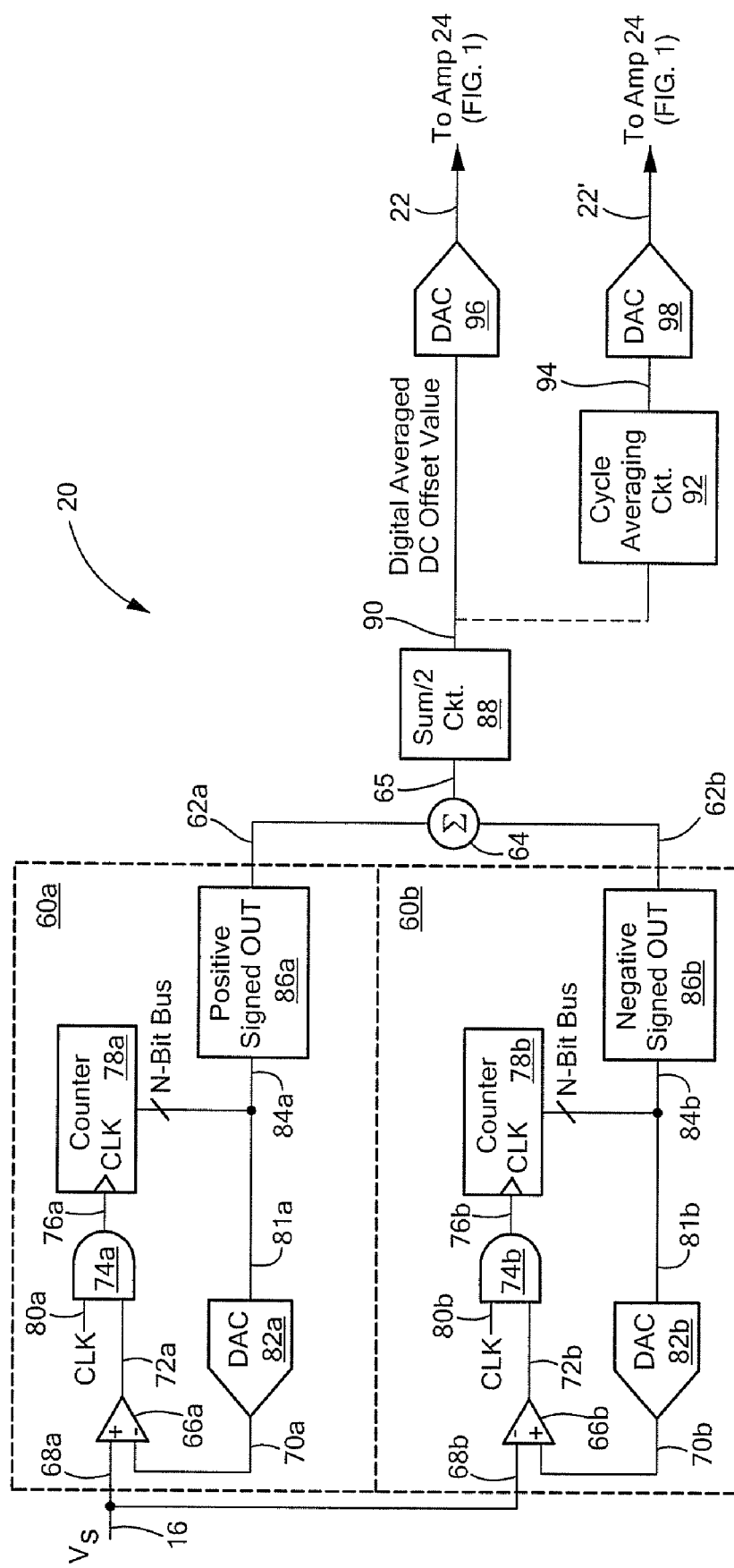
FIG. 3 shows an exemplary DC offset determiner.

Turning now to FIG. 3, details of the DC offset determiner 20 according to one exemplary embodiment are shown. This particular embodiment operates to remove all or substantially all of the DC offset from the AC signal voltage Vs 16. In one implementation, the DC offset determiner 20 may provide as an output the averaged DC offset 22. The DC offset determiner 20 may be implemented to produce an averaged DC offset averaged over more than one cycle, that is, a predetermined number of cycles "N" where N is greater than one, referred to earlier with reference to FIG. 1 as the cycle-averaged DC offset 22'. One or both of the DC offsets 22, 22' may be made available at the output of the DC offset determiner 20.

The sensed AC signal voltage Vs 16 is provided to two separate peak detecting portions (of the DC offset determiner 20): a positive peak detecting portion 60a and a negative peak detecting portion 60b. In the illustrated embodiment, the peak detection is implemented as a digital peak detection. The positive peak detecting portion 60a detects and holds the value of the positive peak excursions of the sensed AC signal voltage Vs, and provides the positive-signed peak value at output 62a. Similarly, the negative peak detecting portion 60b detects and holds the value of the negative peak excursions of the sensed AC signal voltage Vs, and provides the signed negative peak value at output 62b. If there is a DC offset component to the sensed AC signal voltage Vs, it will be present at these outputs. A summing block 64 is used to take the sum of the positive and negative signed peak values at the outputs 62a and 62b, yielding a digital sum value 65.

Still referring to FIG. 3, and more particularly, to the positive peak detector 60a, the analog voltage Vs 16 is input to a comparator 66a, the output of which is a compare signal representative of the instantaneous value of Vs. The comparator 66a has a non-inverting input 68a for receiving input signal Vs and an inverting input 70a for receiving a reference signal. The comparator 66a provides an output 72a to gate 74a, the output of which is provided as an input 76a to a counter 78a. A clock signal 80a is also provided to the gate 74a to clock the input 72a to the counter 78a. The counter 78a provides an N-bit digital output 81a to a digital-to-analog converter (DAC) 82a, which in turn provides an analog output signal (a voltage level representative of the digital count stored in the counter 78a) 70a as a reference input to the comparator 66a. Also, the N-bit digital counter output is provided as an input 84a to a positive peak hold (or latch) unit 86a that stores a positive signed peak value, $+Vp_{max}$.

The comparator 66a compares the input signal appearing as input 68a to the analog voltage 70a from the DAC 82a. If the peak amplitude of the signal Vs at input 68a is greater than that of the signal appearing at input 70a (DAC output), the comparator 66a provides an output to the gate 74a causing the gate 74a to provide a high signal the counter 78a. If the peak amplitude is not greater, a low signal is provided to the counter 78a. The output of counter 78a is input to the digital to analog converter (DAC) 82a, the output of the DAC being a ramp-like signal which is input to the comparator 66a for comparison with Vs. Thus, the compare signal 72a is a high signal (logical 1) when Vs is equal to or greater than the output of the DAC 82a, and a low signal (logical 0) otherwise.

The construction of the negative peak detecting portion 60b mirrors that of the positive peak detecting portion 60a. A comparator 66b has an inverting input 68b for receiving the signal Vs and a non-inverting input 70b for receiving a reference signal. The comparator 66b provides an output 72b to a gate 74b, the output of which is provided as an input 76b to a counter 78b. A clock signal 80b is also provided to the gate 74b to clock the input 72b to the counter 78b. The counter 78b provides an N-bit digital output 81b to a digital-to-analog converter (DAC) 82b, which in turn provides an analog output signal as the reference input 70b to the comparator 66b. Also, an N-bit digital counter output is provided as an input 84b to a negative peak hold (or latch) unit 86b that stores a negative signed peak value, $-Vp_{min}$.

Thus, in each peak detecting portion 60a, 60b, the comparator 66a,66b selectively drives the gate 74a, 74b which in turn drives the counter 78a, 78b containing a digital count. The count in the counter is selectively increased or decreased by a predetermined amount, depending on the condition of the gate and the count in the counter. The count is converted by the digital-to-analog converter (DAC) 82a, 82b to provide the comparator reference signal 70a, 70b. The positive peak value ($+Vp_{max}$) and the negative peak value ($-Vp_{min}$) are measured relative to zero point reference (or ground). The sum value 65, that is, the difference between the positive and negative peak values or amplitudes, is determined for each clock cycle.

The determiner 20 also includes an averaging circuit 88 (shown as "Sum/2 Circuit" 88), which takes the digital sum value 65 and divides that sum by two to produce a digital averaged DC offset value 90. If no DC offset is present in the signal, the value 90 will be zero. Thus, the value 90 equals the averaged value of the DC offset present in the sensed AC signal voltage Vs. It may be desirable to produce an averaged DC offset value that is averaged over N clock cycles, as discussed earlier. Accordingly, and as indicated in the figure, the DC offset determiner 20 may further include a cycle averaging circuit 92 to produce a digital cycle-averaged DC offset value 94. More specifically, the cycle averaging circuit 92 will receive the averaged DC offset value 90 for each of N cycles and determine an average of the N values. The cycle averaging circuit 92 may maintain a running average, or store values 90 and take the average to determine the cycle-averaged DC offset value 94 only when values of N cycles have been received. The selection of N is a matter of design choice.

Once the digital averaged DC offset value 90 has been determined, it is converted to an analog DC offset (that is, averaged DC offset 22) by a third DAC, DAC 96. The averaged DC offset 22 is provided as a voltage input to the amplifier 24 (from FIG. 1). If a digital cycle-averaged value 94 is also provided, a DAC 98 would be employed to convert the digital value to the analog cycle-averaged DC offset 22'. The cycle-averaged DC offset 22' could then be provided as a voltage input to the amplifier 24 instead of the per-cycle averaged DC offset 22. Both offsets 22, 22' could be provided as outputs, with one going to amplifier 24 and the other (or both) being used for other purposes, an example of which will be described with reference to FIG. 5. Although the illustrated DC offset determiner 20 is implemented as a digital design, an analog implementation could be substituted for it.

Figure 4:
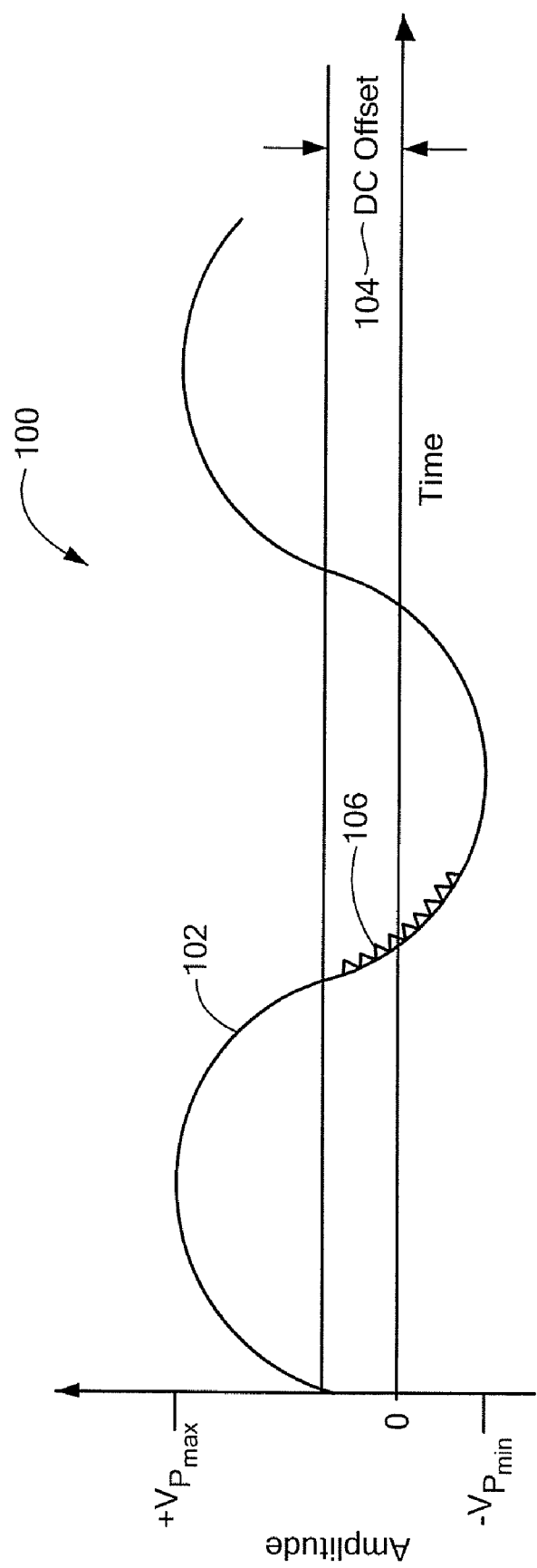
FIG. 4 shows an example waveform for a sensed AC signal with DC offset.

FIG. 4 shows an example AC waveform 100 for a sensed AC signal 102 that contains a DC offset 104. The AC signal is illustrated as a sinusoidal shaped signal. The sinusoidal shaped signal with a DC offset has unequal positive and negative peak values, indicated as $+Vp_{max}$ and $-Vp_{min}$, respectively, relative to the zero point reference. Samples 106 of the AC signal are acquired by the counter/DAC circuitry of each peak detecting portion of the DC offset determiner 20 (from FIG. 3) at a predetermined sampling rate set by the clock frequency. It will be understood that the sensed AC signal 102 is continuously sampled, although only a small interval of samples is shown. The DC offset determiner 20 uses the samples to measure for each cycle the positive peak value ($+Vp_{max}$) and the negative peak value ($-Vp_{min}$) of the AC signal relative to the zero point reference and determines from those peak values the value of the DC offset 104, as discussed earlier with reference to FIG. 3. Taking a simple example, if the AC signal 102 has a 20V peak-to-peak value and the DC offset shift 104 is +1V, the $+Vp_{max}$ value would be +11V and the $-Vp_{min}$ value would be −9V. The DC offset determiner 20 would sum these values to get a +2V amplitude difference, which would then be divided by two to obtain the +1V DC offset and substracted from the AC signal at amplifier 24 (FIG. 1). The resulting signal without DC offset, that is, Vout 18, would have $+Vp_{max}$ and $-Vp_{min}$ values of +10V and −10V, respectively.

Figure 5:
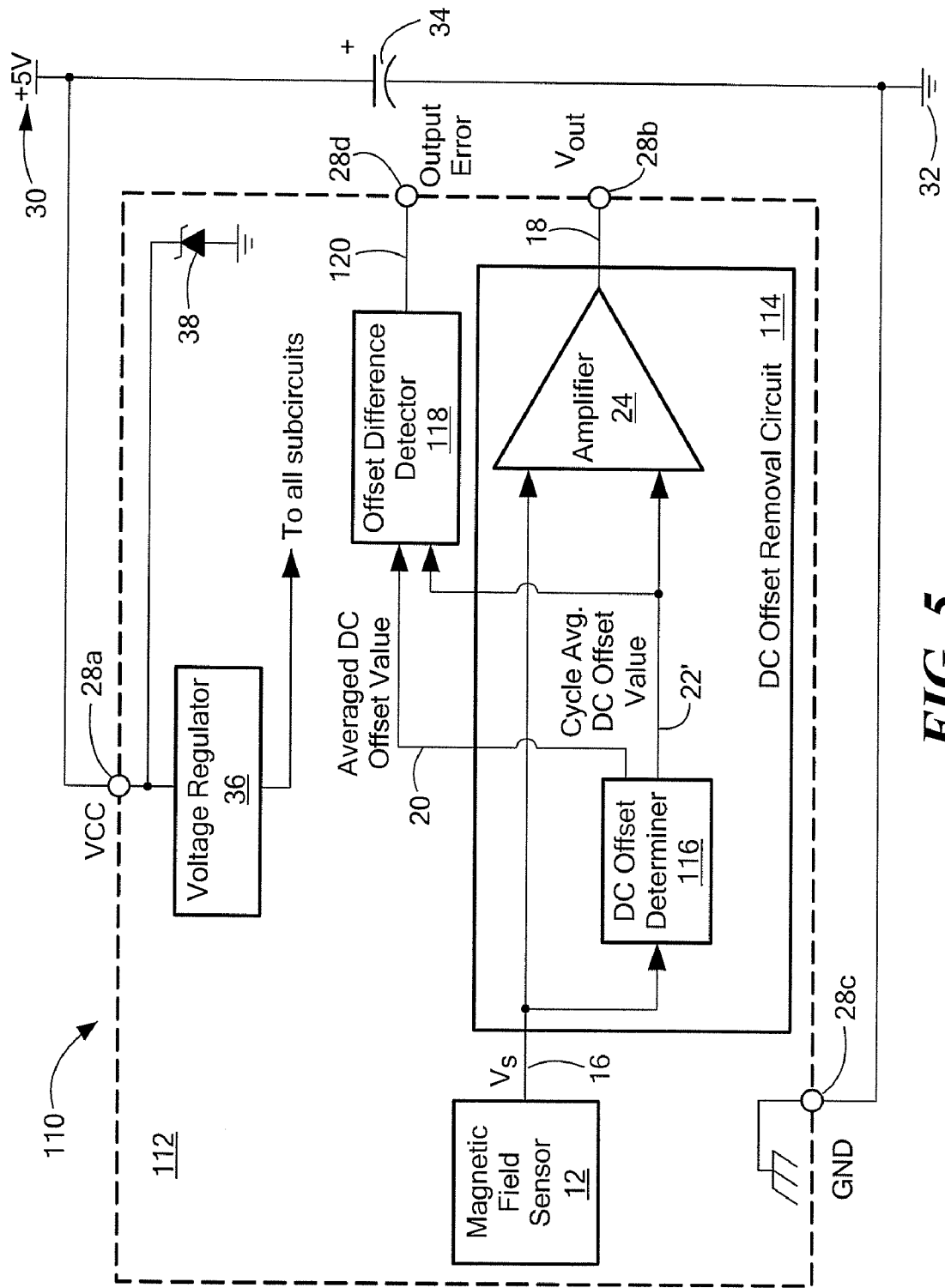
FIG. 5 shows an exemplary alternative sensor embodiment that includes an offset difference detector to produce an output error.

As discussed earlier with reference to FIG. 3, cycle averaging may be used to average the output over a predetermined number of clock cycles N. Such cycle averaging could be used to smooth out the effects of current spikes or start-up glitches in Vs (and therefore the averaged DC offset) over time. In addition, if DC offsets 22 and 22' are made available as outputs of the DC offset determiner 20, it may be possible to track or detect a significant shift in the fundamental averaged DC offset output 22 over time. Referring now to FIG. 5, an alternative embodiment of the sensor 10, shown here as sensor 110, with offset difference detection is shown. The sensor 110 includes a sensor IC or circuit 112 in which magnetic field sensor 12 is coupled to a DC offset removal circuit 114. In this embodiment, the DC offset determiner, shown as DC offset determiner 116, provides as outputs both averaged DC offset value 22 and cycle-averaged DC offset value 22'. One of these values is provided to amplifier 24. In the illustrated example, it is the cycle-averaged DC offset 22' that is provided as an input to the amplifier 24. It will be appreciated, however, that the averaged DC offset 22 could instead be used as a DC offset input to the amplifier 24. In the sensor 110 of FIG. 5, the DC offset removal circuit 114 is coupled to an offset difference detector 118. The offset difference detector 118 receives as inputs the averaged DC offset 22 and the cycle-averaged DC offset 22', and produces as an error output signal 120. The error output signal is provided at a fourth output terminal, shown as an output error terminal 28d. The output error at terminal 28d can be used by an external device (or devices) as a control signal for different purposes, for example, to initiate a fast fault reaction, to simply indicate that the sensor output (Vout 18) may not be correct (in which case immediate corrective action may or may not be taken) or for other purposes.

Figure 6:
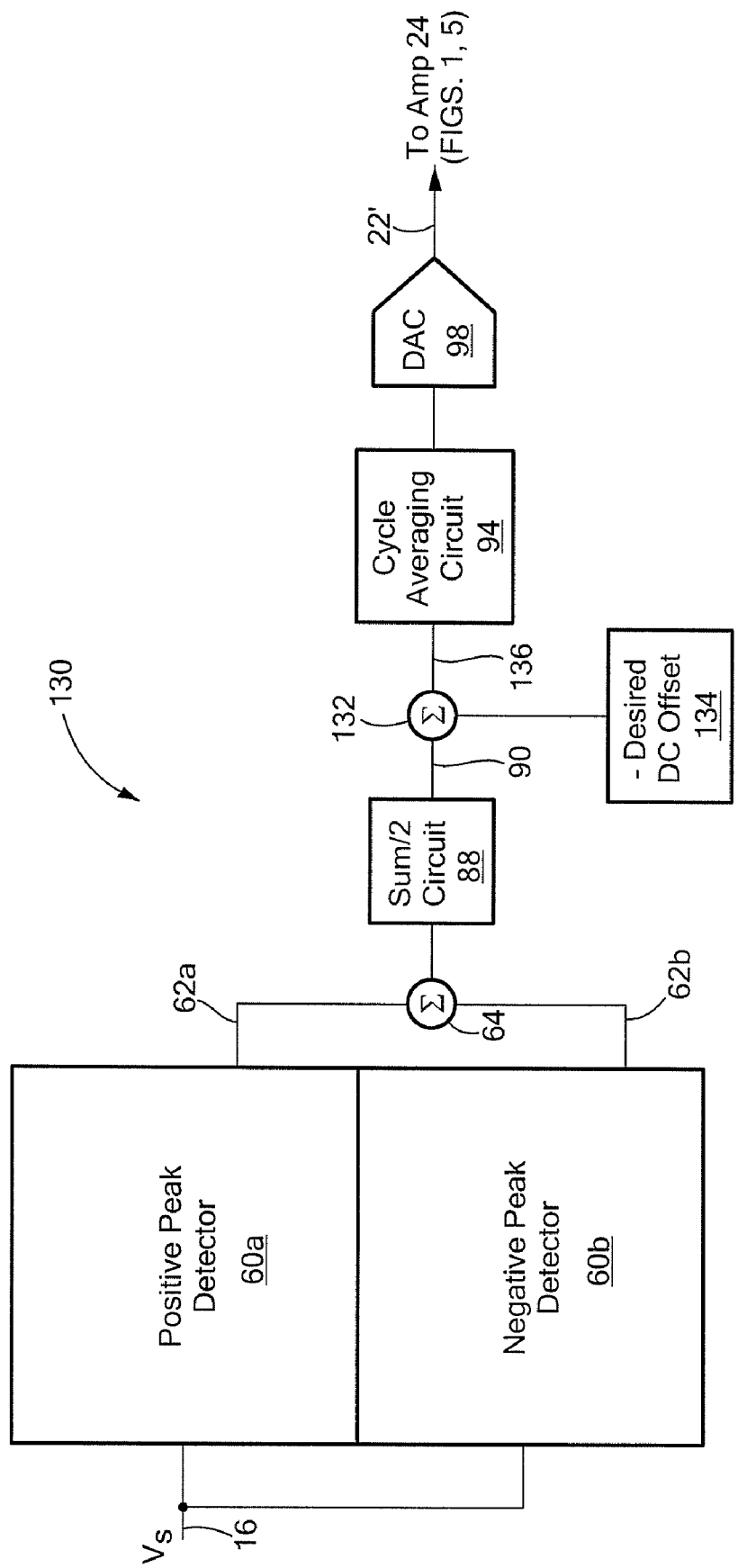
FIG. 6 shows an exemplary alternative embodiment of the DC offset determiner for non-zero DC offset.

As mentioned earlier, it may be desirable to adjust the amount of DC offset so as to remove all (or substantially all) but a known, desired non-zero DC offset. The resulting Vout 18 would therefore include a desired non-zero DC component after the DC offset removal. Accordingly, the DC offset determiner 20 (from FIG. 3) can be designed to allow for a known non-zero DC offset, that is, one that is desired by the sensor user. Referring now to FIG. 6, an alternative DC offset determiner shown as DC offset determiner 130, includes the same peak detectors 60a, 60b, summing block 64, cycle averaging circuit 94 and DAC 98 as the DC offset determiner 20 of FIG. 3. In addition, the determiner 130 includes a second summing block 132 that takes the sum of the value 90 (from the sum/2 circuit 88) and a negative-signed DC offset 134 desired by a user or application. The summing block 132 sums the averaged DC offset 90 and negative-signed desired DC offset 134 to obtain a new averaged DC offset value. Such an embodiment may be useful where it is desirable to allow a known non-zero DC offset while at the same time eliminating or reducing hysteresis effects during sensor use. It will be understood that the second summation performed by summing block 132 could be performed in the analog portion of the circuit, that is, by adding analog output 22' and an analog equivalent of the negative-signed desired DC offset, rather than in the digital domain as it is shown in the figure. Also, the cycle-averaging circuit 94 and DAC 98 could be replaced by DAC 96. If only an averaged DC offset value is provided at 90, the summing block 132 could sum value 90 and value 134 in the digital portion of the determiner circuit or, alternatively, the summing block 132 could be provided after the DAC 96 so that it receives as inputs the DC offset 22 and an analog equivalent of the negative-signed desired DC offset 134. In yet another possible implementation, the determiner 130 could provide both outputs 22 and 22' (as described earlier with reference to FIGS. 3 and 5) and apply the non-zero offset technique to both outputs (either in digital or analog portions of the determiner 130).

Figure 7A:
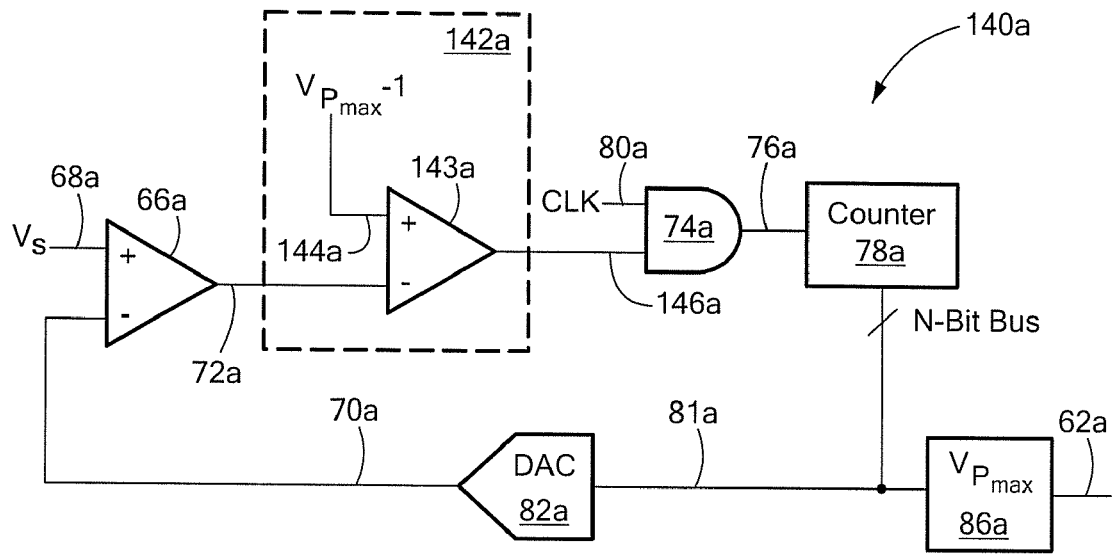
FIGS. 7A-7B show exemplary alternative embodiments of positive peak detection (FIG. 7A) and negative peak detection (FIG. 7B).
Figure 7B:
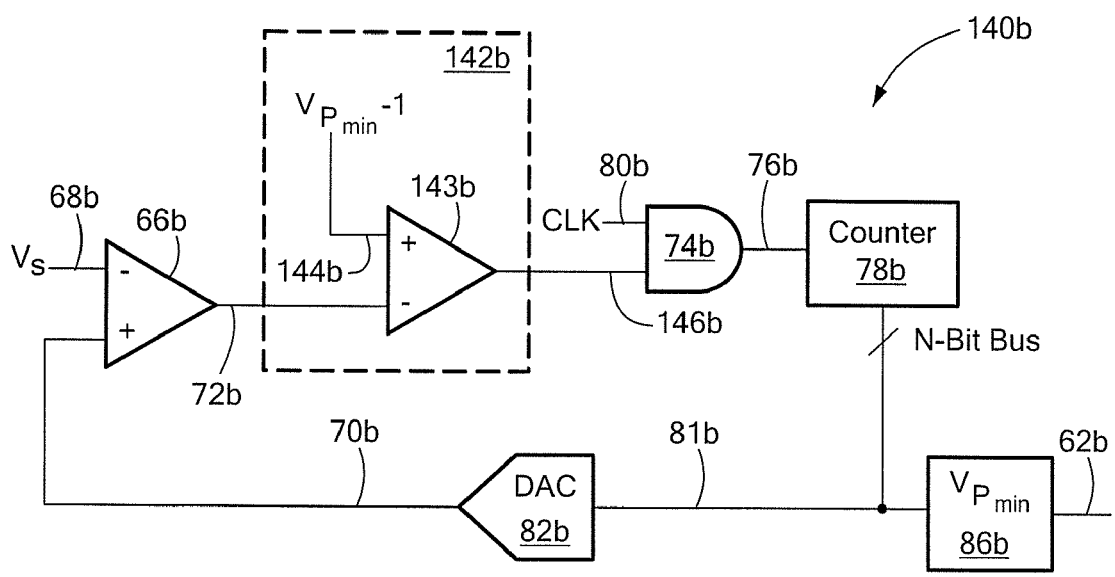

Another useful feature that may be incorporated into the sensor involves the addition of a hold circuit in the peak detectors. An example of this feature is illustrated in FIG. 7A and FIG. 7B. Referring first to FIG. 7A in conjunction with FIG. 3, an alternative embodiment of the positive peak detector 60a, shown in FIG. 7A as positive peak detector 140a, includes a hold circuit 142a. The hold circuit 142a is implemented with a comparator 143a, which receives the output 72a of comparator 66a as a first input and $Vp_{max}-1$, the value of $Vp_{max}$ for the previous clock cycle, as a second input 144a. The comparator 143a provides an output 146a as an input to the gate 74a. If the $Vp_{max}-1$ is larger than the $Vp_{max}$ of the current clock cycle, then the comparator 143a will output a high signal (logical one). FIG. 7B shows the same circuitry, but for the negative peak detector shown as negative peak detector 140b. Thus, detector 140b includes a hold circuit 142b, shown as a comparator 143b. The comparator 143b receives the output 72b of comparator 66b as a first input and $Vp_{min}-1$, the value of $Vp_{min}$ for the previous clock cycle, as a second input 144b. The comparator 143b provides an output 146b as an input to the gate 74b. If the $Vp_{min}-1$ is larger than the $Vp_{min}$ of the current clock cycle, then the comparator 143b will output a high signal (logical one). When the outputs of both of the hold circuit comparators 143a, 143b are a logical one, the outputs of respective gates 74a, 74b, are a logical one. This result would signal, either internally, externally or both, that the Vs waveform had passed a maximum and minimum case for $Vp_{max}$ and $Vp_{min}$, respectively, and that the offset correction would be valid.

The hold circuits 142a, 142b cause the DC offset determination and subsequent removal to be delayed for at least one clock cycle, that is, until at least one instance of $Vp_{max}$ and $Vp_{min}$ has been observed. Because his hold mechanism prevents initial tracking of the Vs 16, it also increases the initial response time of the DC offset removal circuit. Another possible implementation option would be to provide the comparator outputs 72a, 72b to some external pin instead of to gates 74a, 74b. In this way, the hold circuit information could be used to alert the sensor user that DC offset adjustment by the DC offset removal circuitry may not be valid. This latter option would allow the DC offset determination to proceed without delay.

The sensor, with a sensing device and DC offset removal, as described above, can be used in any application that requires an AC signal sensor input and DC offset removal for DC offset introduced in the sensor output signal as a result of the hysteretic nature of the sensing device. It is particularly useful in weak field or low current applications that require a sensing device with high sensitivity, such as energy (watt-hour) metering, for example. MR devices such as GMR devices, often preferred over other types of sensing devices for such applications because of their relatively high sensitivity, are, however, subject to hysteresis effects. Thus, a sensor like those described herein is particularly advantageous for applications that require a sensor input that is highly sensitive to weak magnetic fields and/or small signals, as well as accuracy at the sensor output.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A sensor, comprising:
   a magnetoresistive (MR) sensing device to sense a magnetic field and to produce an AC signal voltage proportional to the sensed magnetic field;
   circuitry, coupled to the MR sensing device, to receive the AC signal voltage and to remove DC offset from the received AC signal voltage;
   wherein the circuitry comprises a DC offset determiner to determine an averaged DC offset for the AC signal voltage; and
   wherein the DC offset determiner includes a positive peak detecting portion to produce a positive peak value, a negative peak detecting portion to produce a negative peak value, a summing block to produce a sum of the positive peak value and the negative peak value and an averaging circuit to divide the sum by two to produce the averaged DC offset.

2. The sensor of claim 1 wherein the positive peak detecting portion, the negative peak detecting portion, the summing block and the averaging circuit operate in the digital domain.

3. The sensor of claim 1 wherein each of the positive and negative peak detecting portions includes a hold circuit to delay offset determination by the DC offset determiner for at least one clock cycle.

4. A sensor, comprising:
   a magnetoresistive (MR) sensing device to sense a magnetic field and to produce an AC signal voltage proportional to the sensed magnetic field;
   circuitry, coupled to the MR sensing device, to receive the AC signal voltage and to remove DC offset from the received AC signal voltage;
   wherein the circuitry comprises a DC offset determiner to determine an averaged DC offset for the AC signal voltage; and
   wherein the DC offset determiner further includes a cycle averaging circuit to produce a cycle-averaged DC offset based on the averaged DC offset provided for a predetermined number of clock cycles.

5. The sensor of claim 4 wherein the circuitry further includes a detector to receive the averaged DC offset and the cycle-averaged DC offset and to produce an error signal therefrom.

6. A sensor, comprising:
   a magnetoresistive (MR) sensing device to sense a magnetic field and to produce an AC signal voltage proportional to the sensed magnetic field;
   circuitry, coupled to the MR sensing device, to receive the AC signal voltage and to remove DC offset from the received AC signal voltage;
   wherein the circuitry comprises a DC offset determiner to determine an averaged DC offset for the AC signal voltage; and
   wherein the DC offset determiner further includes circuitry to adjust the averaged DC offset so that the AC signal voltage includes a non-zero DC component after the DC offset removal.

7. A current sensor comprising:
   a conductor to which a current to be measured in applied;
   a MR sensing device, responsive to a magnetic field generated in the conductor when current is applied to the conductor, to produce an AC signal voltage proportional to the current;
   circuitry, coupled to the MR sensing device, to receive the AC signal voltage and to remove DC offset from the received AC signal voltage;
   wherein the circuitry includes a DC offset determiner to determine an averaged DC offset for the AC signal voltage; and
   wherein the DC offset determiner includes a positive peak detecting portion to produce a positive peak value, a negative peak detecting portion to produce a negative peak value, a summing block to produce a sum of the positive peak value and a negative peak value and an averaging circuit to divide the sum by two to produce the averaged DC offset.

8. A method comprising:
   sensing a magnetic field with an MR sensing device and producing an AC signal voltage proportional to the sensed magnetic field;
   removing DC offset from the AC signal voltage;
   wherein removing comprises determining an averaged DC offset for the AC signal voltage; and
   wherein determining comprises:
   determining, for a given cycle, a positive peak value and a negative peak value for the AC signal voltage; and
   using the positive peak value and the negative peak value to produce the averaged DC offset.

* * * * *